United States Patent
Anma et al.

(10) Patent No.: US 6,294,227 B1
(45) Date of Patent: *Sep. 25, 2001

(54) METHOD OF FORMING PROTECTIVE FILM ON PLASTIC PART FOR VEHICLE-USE AND APPARATUS

(75) Inventors: Hidetaka Anma; Yoshinori Hatanaka, both of Shizuoka (JP)

(73) Assignee: Koito Manufacturing Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/589,879

(22) Filed: Jun. 9, 2000

(30) Foreign Application Priority Data

Jun. 9, 1999 (JP) .................................................. 11-162469

(51) Int. Cl.[7] ..................................................... H05H 1/24

(52) U.S. Cl. ............................. 427/578; 118/50; 118/500; 118/723 I; 118/723 VE; 427/248.1; 427/585

(58) Field of Search .................................... 427/574, 578, 427/585, 248.1; 118/723 VE, 723 I, 50, 500

(56) References Cited

U.S. PATENT DOCUMENTS

| | | | |
|---|---|---|---|
| 4,998,968 | * | 3/1991 | Misumi . |
| 5,554,418 | * | 9/1996 | Ito et al. . |
| 5,840,374 | * | 11/1998 | Ito et al. . |
| 6,025,013 | * | 2/2000 | Heming et al. . |
| 6,070,551 | * | 6/2000 | Li et al. . |

* cited by examiner

*Primary Examiner*—Bernard Pianalto
(74) *Attorney, Agent, or Firm*—Sughrue, Mion, Zinn, Macpeak & Seas, PLLC

(57) ABSTRACT

A method of forming a uniform-thickness good-quality protective film with scratch-proofness and ultraviolet cutting characteristic on a plastic part having a diversified and complex three-dimensional shape without wasteful release of an organic solvent, or the like, into the atmosphere. In a plasma chemical vapor deposition apparatus, the shape of at least one part of a surface of a cathode provided in a reaction chamber is made coincident with the shape of a surface of a plastic part such as a car headlamp lens, or the like. The plastic part is attached to the cathode in the condition that the two surfaces coincident in shape come into contact with each other. High-frequency electric power is supplied between the cathode and the reaction chamber while a hydrogen gas and hexamethyldisilane (HMDS) as a raw material gas for forming a protective film are imported into the reaction chamber. Thus, a protective film is formed on the surface of the plastic part by vapor deposition.

14 Claims, 6 Drawing Sheets

| PRESSURE IN REACTION CHAMBER | 14Pa |
| --- | --- |
| TEMPERATURE IN REACTION CHAMBER | ROOM TEMPERATURE |
| HIGH - FREQUENCY OUTPUT | 100W |
| He FLOW RATE | 5cc/min. |
| $H_2$ FLOW RATE | 10cc/min. |
| DEPOSITION TIME | 15min. |

| PRESSURE IN REACTION CHAMBER | 14Pa |
| --- | --- |
| TEMPERATURE IN REACTION CHAMBER | ROOM TEMPERATURE |
| HIGH - FREQUENCY OUTPUT | 200W |
| He FLOW RATE | 5cc/min. |
| $H_2$ FLOW RATE | 10cc/min. |
| DEPOSITION TIME | 100min. |

| PRESSURE IN REACTION CHAMBER | 14Pa | He FLOW RATE | 5cc/min. |
| | | H₂ FLOW RATE | 10cc/min. |

PRESSURE IN REACTION CHAMBER  14Pa
TEMPERATURE IN REACTION CHAMBER  ROOM TEMPERATURE
HIGH - FREQUENCY OUTPUT  200W
He FLOW RATE  5cc/min.
H2 FLOW RATE  10cc/min.
DEPOSITION TIME  100min.

METHOD OF FORMING PROTECTIVE FILM ON PLASTIC PART FOR VEHICLE-USE AND APPARATUS

BACKGROUND OF THE INVENTION

1. Field of the Invention

The present invention relates to a method of forming a protective film with scratch-proofness and ultraviolet cutting characteristic on a surface of a plastic car part.

2. Description of the Related Art

Thermoplastic materials which can be easily recycled are widely used for car-use parts, or the like, in order to reduce weight and protect the environment. For example, a polycarbonate resin is mainly used as a lens material for a car headlamp to reduce weight and provide high impact strength. If such a plastic material is used for an exterior part of a car, there is, however, a weak point that the exterior part is apt to be scratched because the material itself is low in surface hardness and that the exterior part is deteriorated by ultraviolet rays and heat radiated from the sun to thereby cause discoloration, deformation and reduction in strength.

To compensate for the weak point, a protective film with scratch-proofness and ultraviolet cutting characteristic was heretofore formed mainly on a plastic surface, for example, by spraying acrylic paint.

The shape of such a plastic part used in a car was, however, a diversified and complex three-dimensional shape. In a surface coating process for spraying paint onto such an part, it was difficult to form a protective film with a uniform thickness. Moreover, coating efficiency onto a plastic surface was so low that most of an organic solvent might be wastefully released into the atmosphere or the paint might be deposited on an undesirable surface.

Therefore, it is required that a protective film of uniform thickness and good quality with scratch-proofness and ultraviolet cutting characteristic and the like be formed on a plastic part having a diversified and complex three-dimensional shape while wasteful release of an organic solvent, or the like, into the atmosphere can be avoided.

SUMMARY OF THE INVENTION

In order to achieve the above object, according to a first aspect of the invention, there is provided a method of forming a protective film on a car-use plastic part by use of a plasma chemical vapor deposition apparatus in which a shape of at least one part of a surface of a cathode provided in a reaction chamber coincides with a shape of a surface of a thin car-use plastic part, the method comprising the steps of: attaching the plastic part to the cathode in a condition that the two surfaces coincident in shape come into contact with each other; and performing plasma chemical vapor deposition by supplying high-frequency electric power between the reaction chamber and the cathode while importing a hydrogen gas and an organic silicon gas into the reaction chamber. According to this method, the organic solvent, or the like, is not wastefully released into the atmosphere because the protective film is formed by plasma chemical vapor deposition in the reaction chamber. Moreover, the efficient dissociative ionization of the organic silicon gas is efficiently dissociated so as to be ionized by the action of hydrogen radicals in the hydrogen gas; the potential of the cathode becomes a negative bias value so that an ion sheath is formed with ions concentrated in the periphery of the cathode; and the plastic part can be disposed in the ion sheath so that ions in the ion sheath are attracted toward the cathode uniformly and slowly and deposited, as a film of approximately uniform thickness, on a surface of the plastic part. Hence, a protective film of approximately uniform thickness and good quality can be formed on the surface of the plastic part having such a complex three-dimensional shape. Moreover, the organic silicon is a high-safety material which has molecules containing Si—C bonds for providing hardness and absorbing ultraviolet rays. Hence, the protective film with scratch-proofness and ultraviolet cutting characteristic can be obtained safely and easily.

According to a second aspect of the invention, the organic silicon gas is hexamethyldisilane. Hexamethyldisilane is a fire-resistant high-safety material which contains Si—Si bonds and Si—C bonds. Hence, the Si—Si bonds are first broken by the action of the hydrogen radicals to thereby form a precursor. The precursor is deposited on the surface of the plastic part to thereby form a protective film more efficiently. Moreover, the protective film obtained by this method can transmit visible light so as to be kept highly transparent while cutting ultraviolet rays.

According to a third aspect of the invention, the organic silicon gas is composed of monosilane and hexamethyldisilane in the condition that the molar ratio of monosilane to hexamethyldisilane is in a range of from 0:1 to 5:1. The protective film thus obtained can cut ultraviolet rays more sufficiently because the addition of monosilane permits the protective film to contain a large amount of Si having a function of making ultraviolet absorption good.

According to a fourth aspect of the invention, the hexamethyldisilane is imported together with a helium carrier gas into the reaction chamber. Hence, even hexamethyldisilane low in vapor pressure at room temperature can be imported into the reaction chamber sufficiently as long as it is mixed with the helium carrier gas.

According to a fifth aspect of the invention, a car-use plastic headlamp lens has a protective film formed on a surface of the lens by a method defined as above. The car headlamp lens has good scratch-proofness and ultraviolet light resistance because the protective film of approximately uniform thickness and good quality with scratch-proofness and ultraviolet cutting characteristic is formed on a surface of the lens. Moreover, a contribution to the protection of the environment can be made because an organic solvent, or the like, is not wastefully released into the atmosphere when the protective film is formed. In addition, the lens does not suffer from deformation and deterioration due to heat at the time of the formation of the protective film.

According to the present invention, a protective film containing an SiC (silicon carbide) polymer is formed on a surface of a car-use plastic part by a cathode deposition method using plasma chemical vapor deposition (hereinafter referred to as plasma CVD) in order to give scratch-proofness, ultraviolet light resistance, etc. to a plastic material such as a polycarbonate resin.

DETAILED DESCRIPTION OF THE PREFERRED EMBODIMENTS

A preferred embodiment of the present invention will be described below in detail with reference to the accompanying drawings.

Figure 1:
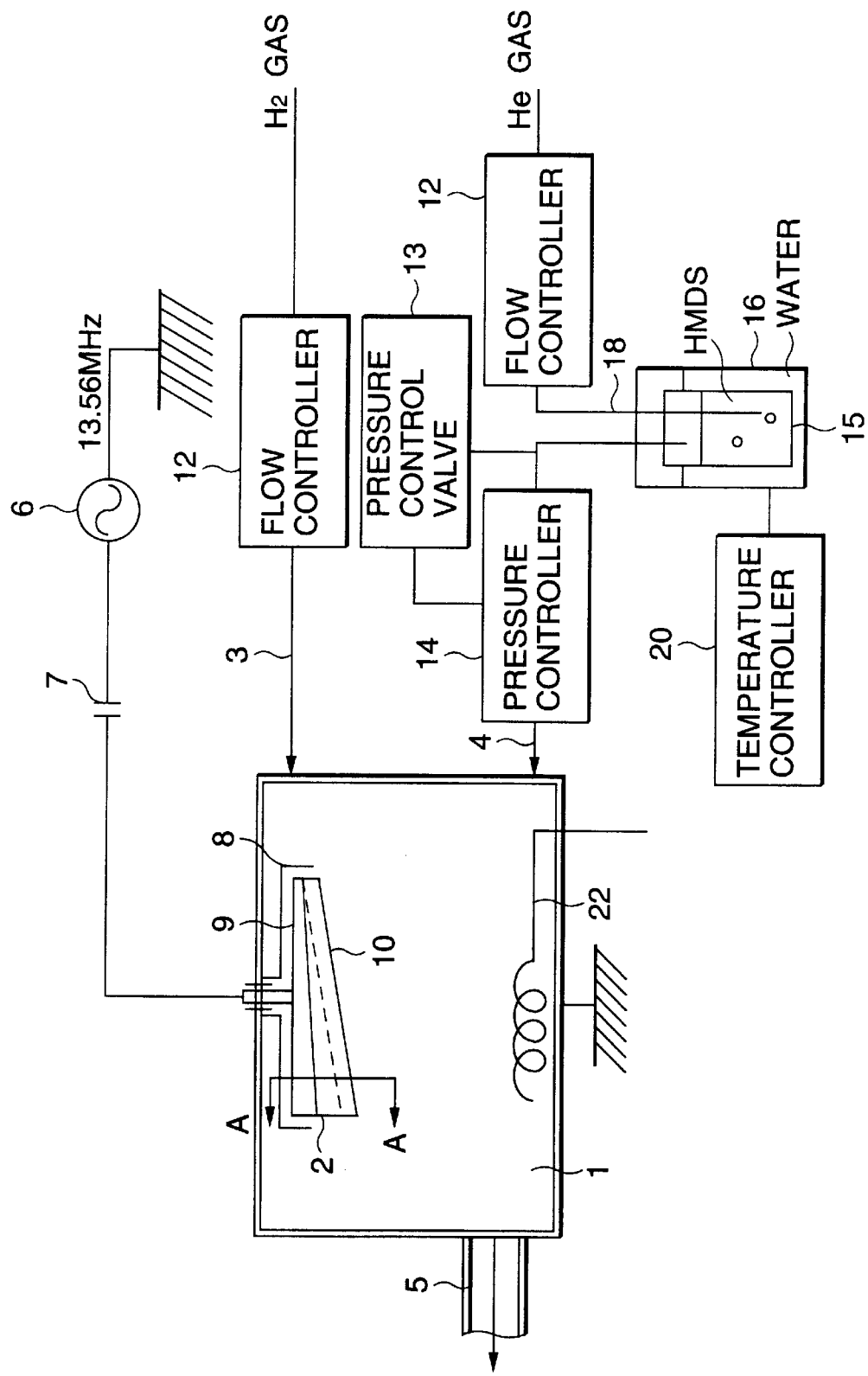
FIG. 1 is a view showing a plasma chemical vapor deposition apparatus for a car.
Figure 2:
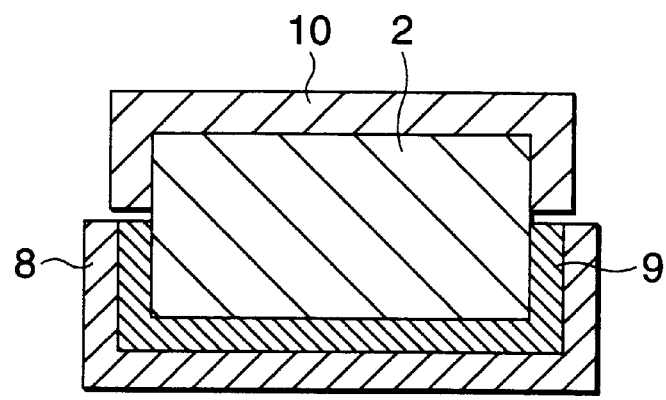
FIG. 2 is a sectional view taken along the line A—A in FIG. 1.

FIG. 1 shows a plasma chemical vapor deposition apparatus to be used in the present invention. The plasma chemical vapor deposition apparatus has a reaction chamber 1 which is connected to an evacuation pipe 5 connected to a vacuum pump and which is evacuated to a high vacuum. A cathode 2 is disposed in an upper portion of the reaction chamber 1. The cathode 2 has a surface shape which is such that at least one part of the surface shape coincides with the surface shape of a thin plastic part. Hence, the plastic part can be attached to the cathode in the condition that the two surfaces coincident in shape come into contact with each other. When, for example, the plastic part is a car headlamp lens 10 as shown in section in FIG. 2, a shape along a surface of the lens 10 is also formed as a part of the surface of the cathode 2 so that the two members can be connected in the condition that the surfaces coincident in shape come into contact with each other. In the cathode 2, a portion to which the plastic part is not attached is covered with a shield member 8 grounded to the reaction chamber 1 in order to prevent a protective film component from being deposited. Moreover, an electrically insulating film 9 is put between the shield member 8 and the cathode 2.

A high-frequency power unit 6 is provided to supply high-frequency electric power (13.56 MHz) between the cathode 2 and the reaction chamber 1. Here, a bias capacitor 7 is disposed between the cathode 2 and the high-frequency power unit 6. Further, a heater 22 for adjusting the temperature in the reaction chamber 1 is provided in the reaction chamber 1.

The reaction chamber 1 is configured so that a high-purity hydrogen ($H_2$) gas and an organic silicon gas as a raw material gas for forming a protective film can be imported into the reaction chamber 1. The hydrogen gas is imported into the reaction chamber 1 through a hydrogen import pipe 3 after the hydrogen gas is made to pass through a flow controller 12. The hydrogen gas is used for dissociating molecules of the material gas easily by the action of hydrogen radicals.

Figure 11:
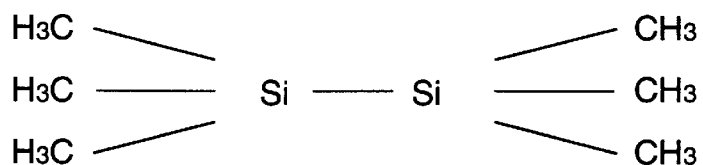
FIG. 11 is a structural formula of HMDS.

Any material may be used as a raw material of the protective film as long as the material contains a component which can give predetermined hardness and ultraviolet cutting characteristic. Organic silicon is first conceivable as the raw material. This is because organic silicon is a high-safety raw material which has molecules containing SiC which can give predetermined hardness and ultraviolet cutting characteristic. That is, the use of organic silicon makes it possible to obtain a good-quality protective film safely and easily. In organic silicon, hexamethyldisilane ($Si_2(CH_3)_6$, hereinafter referred to as HMDS) is particularly suitable in terms of safety and facilitation of forming the protective film. Because HMDS has Si—Si bonds and Si—C bonds as shown in FIG. 11, the Si—Si bonds of HMDS are first broken by hydrogen radicals to thereby produce a precursor. It is conceived that a protective film is formed efficiently by deposition of the precursor on a surface of the plastic part. Further, HMDS cuts ultraviolet rays sufficiently because HMDS contains Si—C bonds with a band gap approximately in a range of from 4.5 eV to 5 eV. In this embodiment, therefore, HMDS was used as a raw material of the protective film.

The vapor pressure of HMDS is low because HMDS is a liquid at room temperature. Therefore, in the condition that an HMDS vessel 15 is bathed in a water bath 16, the temperature of water in the water bath 16 is adjusted by a temperature controller 20 so that HMDS is heated to about 30° C. to thereby heighten the vapor pressure of HMDS. A helium (He) carrier gas is blown into the HMDS liquid through a helium import pipe 18 after the helium carrier gas is made to pass through a flow controller 12. HMDS is frothed by the helium gas to thereby obtain a mixture gas of HMDS and He. The mixture gas is provided so that the mixture gas is imported into the reaction chamber 1 through a material import pipe 4 after the mixture gas is made to pass through a pressure control valve 13 and a pressure controller 14. In this manner, even HMDS low in vapor pressure at room temperature can be imported into the reaction chamber sufficiently because HMDS can be mixed with the helium carrier gas.

To form a protective film containing an SiC polymer on a surface of a plastic part by use of the foregoing plasma chemical vapor deposition apparatus, the plastic part such as the lens 10, or the like, is first attached to the cathode 2. Then, after the reaction chamber 1 is evacuated to a high vacuum with a vacuum pump, a hydrogen gas and a mixture gas of an He carrier gas and HMDS are imported into the reaction chamber 1 and, at the same time, high-frequency electric power is supplied between the cathode 2 and the reaction chamber 1. As a result, glow discharge is generated between the cathode 2 and the reaction chamber 1 so that the gas in the reaction chamber 1 is obtained as plasma. In this occasion, it is conceived that the Si—Si bonds of HMDS are broken by hydrogen radicals to thereby produce a precursor and that the precursor is deposited on a surface of the plastic part and broken parts of the precursor are further deposited thereon successively to thereby form the protective film efficiently.

In this manner, the protective film is formed in the reaction chamber 1 by plasma CVD. Hence, an organic solvent, or the like, is not wastefully released into the atmosphere. Moreover, the protective film can be formed at a low temperature. Hence, the plastic part does not suffer from deformation and deterioration due to heat when the protective film is formed.

Incidentally, in the periphery of the cathode 2, the velocity of electrons is very high compared with the velocity of ions. Hence, only electrons flow into the cathode speedily, so that the cathode becomes negatively charged with a negative self-bias potential. On the other hand, an ion sheath in which ions unable to reach the cathode are concentrated is formed in the periphery of the cathode 2. When the cathode 2 has such a negative bias potential, the bias capacitor 7 disposed between the cathode 2 and the high-frequency power unit 6 holds the negative bias potential of the cathode 2. Further, in the case of a thin plastic part such as a car headlamp lens 10, the plastic part can be placed in the ion sheath because at least one part of the surface shape of the cathode is a shape along the plastic part. As a result, ions obtained by dissociation and ionization of HMDS are dense in the ion sheath. It is conceived that the ions are uniformly attracted toward the cathode 2 by the bias potential of the cathode 2 and deposited as a film of approximately uniform thickness on a surface of the plastic part to thereby form a protective film. It is conceived that the thickness of the ion sheath is formed uniformly throughout the electrode.

An experiment was carried out to form a protective film at room temperature by the aforementioned plasma chemical vapor deposition apparatus using a cathode with an area of 1225 $cm^2$.

Figure 3:
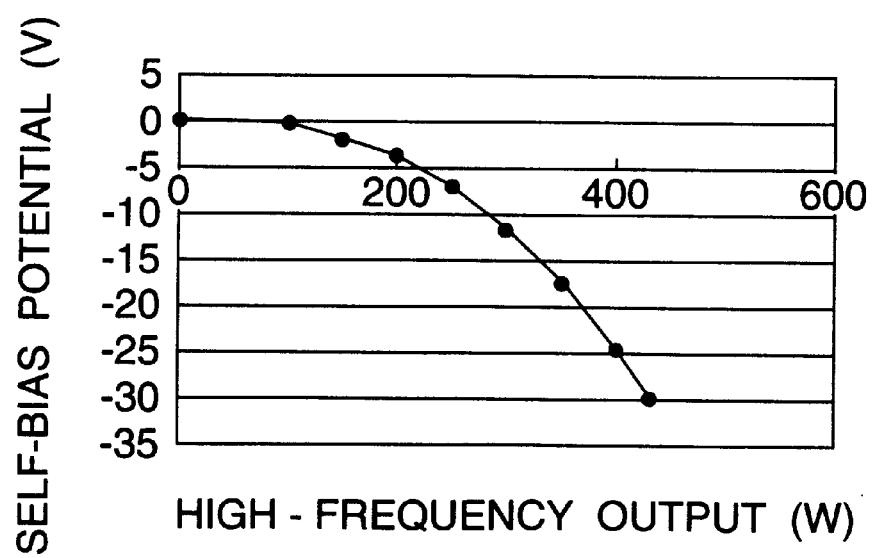
FIG. 3 is a graph showing the relation between high-frequency output and self-bias potential of the cathode.

First, the self-bias potential generated in the cathode of the apparatus was measured. FIG. 3 shows the relation between the high-frequency output and the self-bias potential generated in the cathode. When the high-frequency output was 200 W, the self-bias potential generated was a negative potential of about −5 V. When the high-frequency output was 300 W, the self-bias potential generated was a negative potential of about −12 V. It is conceived that, when such a negative bias potential is generated, ions in the ion sheath generated in the periphery of the cathode are slowly uniformly attracted toward the cathode to thereby promote the formation of the protective film efficiently.

Next, an experiment was carried out to form a protective film in the condition that a sample piece such as a monocrystalline silicon substrate or a quartz glass substrate was attached onto the cathode. Monocrystalline silicon or quartz glass was used for the experiment to make it possible to examine the characteristic of the protective film in detail.

Figure 4:
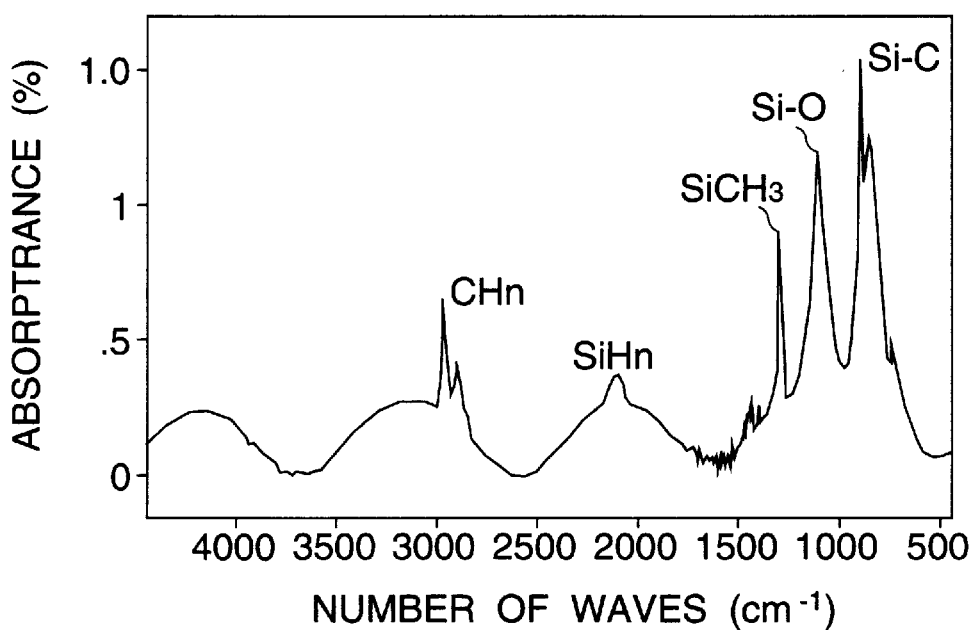
FIG. 4 is a graph showing the infrared absorption spectrum of the protective film.

The protective film formed on the monocrystalline silicon substrate at room temperature had a thickness in a range of from 0.2 to 0.3 $\mu m$(microns). FIG. 4 shows the infrared absorption spectrum characteristic of the protective film. As shown in FIG. 4, an absorption peak of Si—C at the number of waves of 800 $cm^{-1}$, an absorption peak of $SiCH_3$ at the number of waves of 1260 $cm^{-1}$, an absorption peak of $CH_n$ at the number of waves in a range of from 2860 to 3000 $cm^{-1}$ and an absorption peak of $SiH_n$ at the number of waves of 2105 $cm^{-1}$ were confirmed in the protective film. Further, intensive absorption in of SiO occurs at 1050 $cm^{-1}$. It is conceived that this is because oxygen molecules adsorbed on the sample piece have not been removed from the sample piece but are taken into the protective film.

Figure 5:
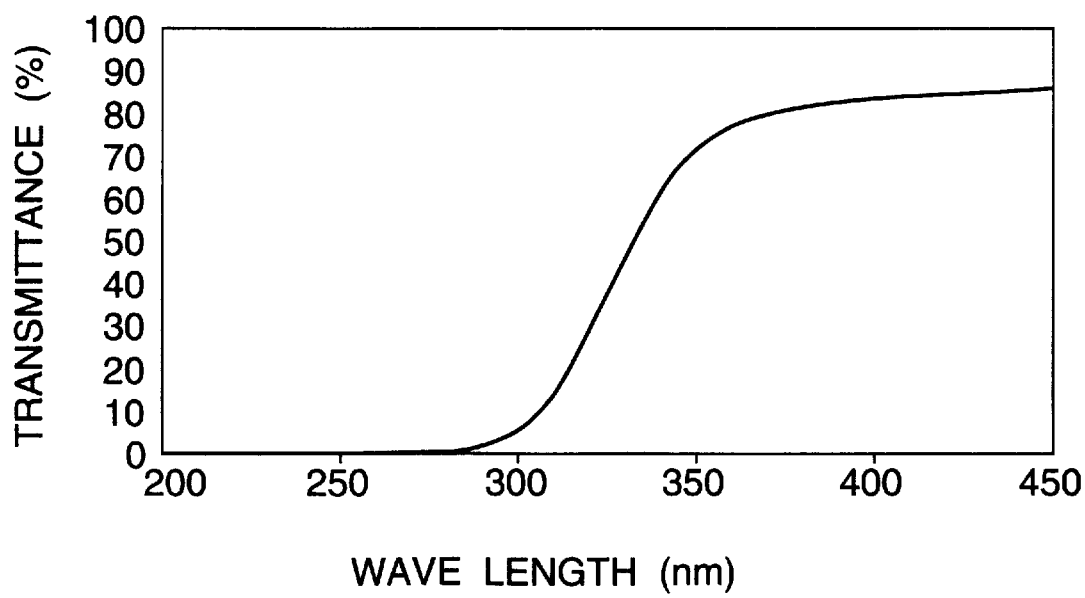
FIG. 5 is a graph showing the ultraviolet spectral transmittance curve of the protective film.

FIG. 5 shows the ultraviolet spectral transmittance curve of the protective film formed on transparent quartz glass at room temperature. A sample piece having a protective film 3 $\mu m$ thick formed on quartz glass was used for the measurement of the transmittance curve. Incidentally, the transmittance curve of the protective film was obtained by subtraction of the absorption curve of quartz glass. The protective film is found to have the property of transmitting visible light mostly but beginning to cut ultraviolet light at a wave length of 400 nm so that the shorter the wave length is, the better ultraviolet light is cut, that is, 50% of ultraviolet light is cut at a wave length of 330 nm and the most part of ultraviolet light is cut at a wave length of not larger than 300 nm. As is obvious from FIG. 4, absorption of SiO with a wide band gap is confirmed in the protective film. Hence, the adjustment of the ultraviolet light cutting performance of the protective film can be expected to be achieved by the adjustment of the oxygen or silicon content of the protective film.

Further, an experiment was carried out to deposit a protective film on a transparent and colorless polycarbonate, which are widely used for car-use parts.

Figure 6:
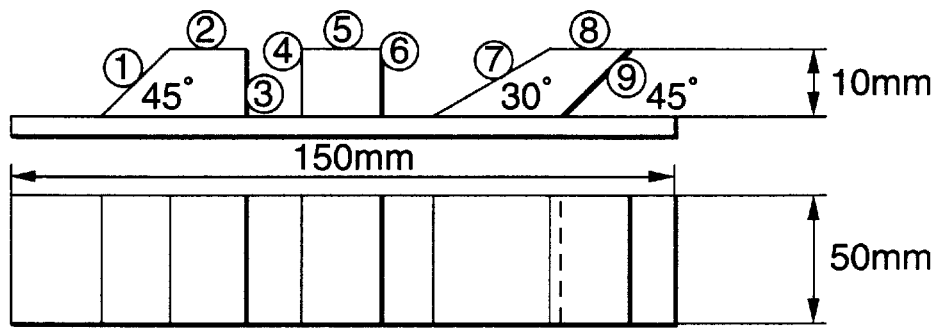
FIG. 6 is a view showing the shape of a cathode used in an experiment for forming the protective film.
Figure 7:
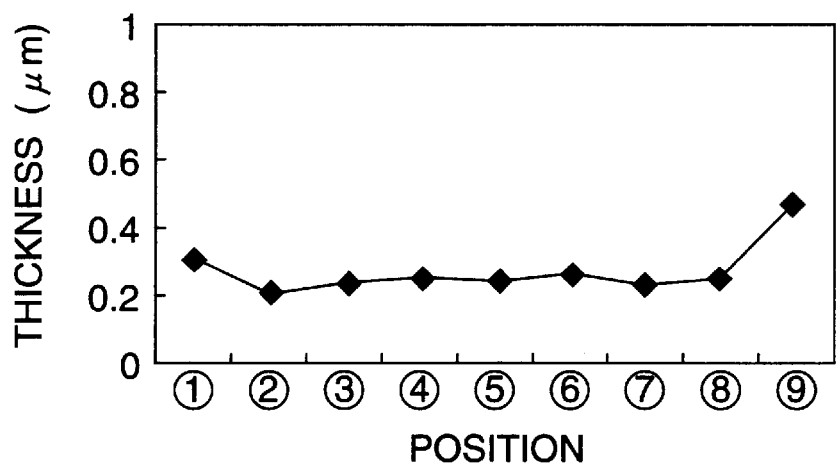
FIG. 7 is a graph showing the thicknesses of respective positions of the protective film in the case where the protective film is formed by use of the cathode of the shape depicted in FIG. 6.

Incidentally, in most cases, car-use plastic part, etc. are not flat but have rather complex three-dimensional shapes with uneven surfaces, or the like. Therefore, as shown in FIG. 6, the surface shape of the cathode was formed as a complex three-dimensional shape and small pieces of polycarbonate were adhesively bonded to respective regions of the shape. In this condition, the experiment was carried out to form a protective film. FIG. 7 shows the thicknesses as a result of measurement in various measurement regions. There is little difference in film thickness observed in positions each having an uneven portion with a level difference of 10 mm, that is, in the positions (2), (5) and (8) which are flat surfaces and in the positions (3), (4) and (6) which are vertical surfaces. In the positions (2) to (8), the protective film is formed with an approximately uniform thickness having a film thickness difference within about 10%. Only in each of positions (1) and (9), the thickness of film obtained had a slightly large value. It is conceived that this results from the uniform distribution of vaporized HMDS monomer in the reaction chamber.

Figure 8:
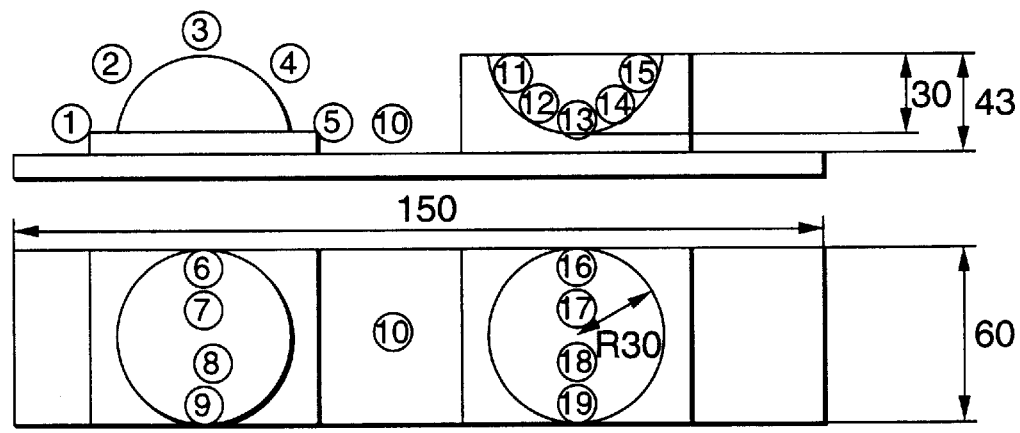
FIG. 8 is a view showing the shape of another cathode used in an experiment for forming the protective film.
Figure 9:
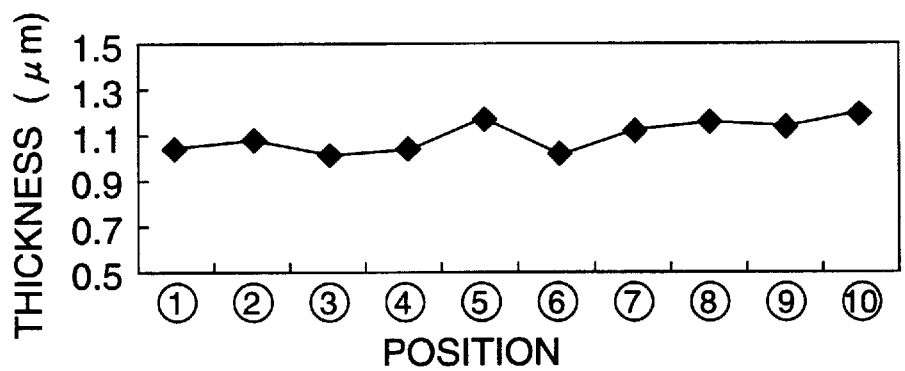
FIG. 9 is a graph showing the thicknesses of respective positions of the protective film on a convex surface in the case where the protective film is formed by use of the cathode of the shape depicted in FIG. 8.
Figure 10:
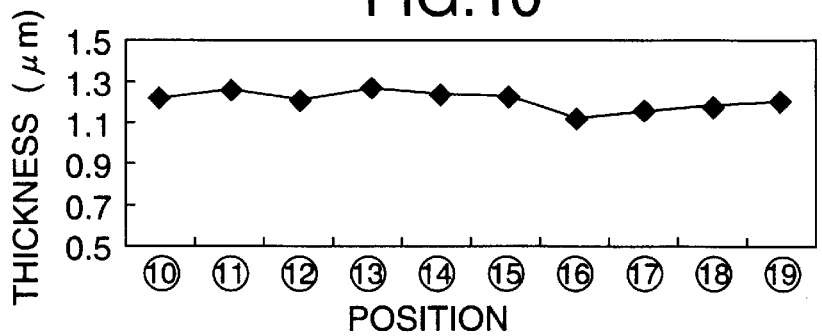
FIG. 10 is a graph showing the thicknesses of respective positions of the protective film on a concave surface in the case where the protective film is formed by use of the cathode of the shape depicted in FIG. 8.

An experiment was further carried out to form a protective film with use of a cathode having a curved surface. FIG. 8 shows the cathode used in this experiment. The experiment was carried out to form a protective film in the condition that a sheet of polycarbonate 0.5 mm thick was adhesively bonded to a curved surface portion of the cathode having a concave-convex curved surface (radius: 30 mm). FIG. 9 shows the thicknesses of the protective film in respective positions of a convex surface. FIG. 10 shows the thicknesses of the protective film in respective positions of a concave surface. Positions (1) to (5) and positions (6) to (9) are located on the convex surface. Positions (11) to (15) and positions (16) to (19) are located on the concave surface. In these positions, the film thickness difference of the protective film is within 10%. It was found that the protective film was formed with an approximately uniform film thickness in both the convex and concave surfaces.

It was further found that the influence of high-frequency output and ionic strength has also a strong relation with the formation of the protective film. In the experiment to form the protective film on the sample piece, the formed protective film cracked when the high-frequency output was not lower than 300 W. It is conceived that this is because the surface of the protective film was damaged by collision of high-energy ions, or the like, generated by the high-frequency output. This suggests that the moderate adjustment of ionic strength and high-frequency output is required for formation of a good protective film.

It is obvious from the aforementioned experimental result that the protective film obtained by a cathode deposition method using plasma CVD according to this embodiment has scratch-proofness and ultraviolet cutting characteristic. It is also obvious that a protective film uniform in thickness and good in quality can be formed on a plastic part having a complex three-dimensional shape and that the protective film does not crack when the protective film is formed.

In another embodiment, HMDS and monosilane ($SiH_4$) may be used as raw materials of the protective film so that the monosilane gas can be imported into the reaction chamber 1 through a flow controller and a material import pipe provided separately from those for HMDS. When monosilane containing a large amount of an Si component is added as a raw material in the aforementioned manner, the ultraviolet cutting characteristic of the protective film can be improved more greatly because the Si component having a narrow band gap and having strong ultraviolet absorption increases in the protective film.

Figure 12:
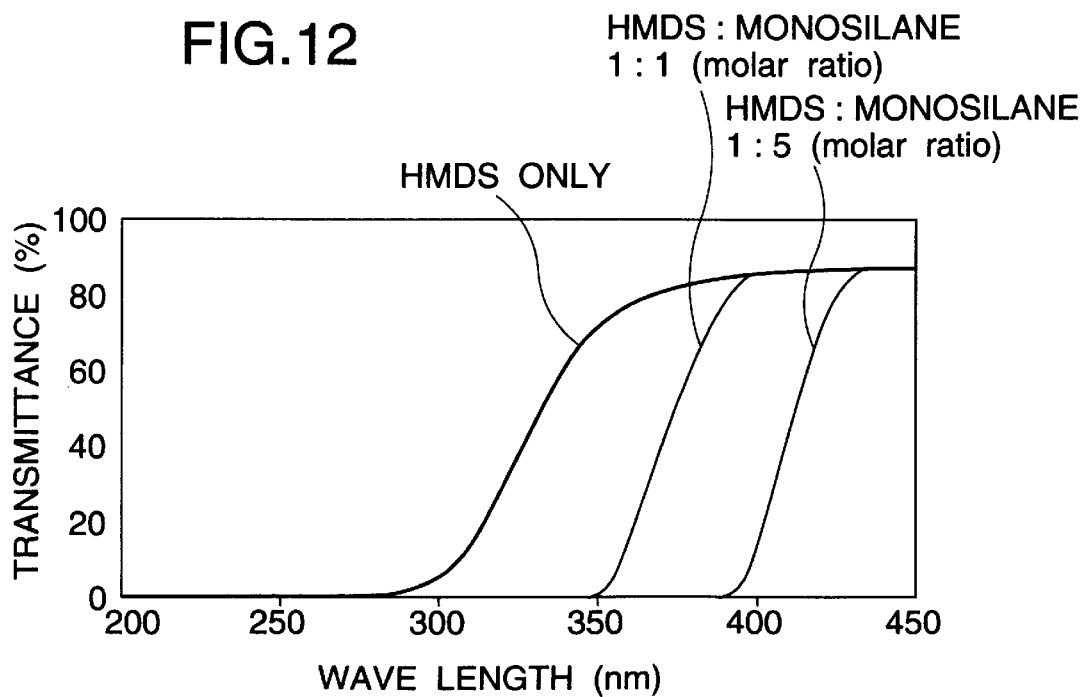
FIG. 12 is a graph showing the relation between the molar ratio of HMDS to monosilane and the ultraviolet transmittance curve of the protective film.

To examine the effect of this embodiment, protective films were formed in the aforementioned manner while the molar ratio of HMDS to monosilane to be supplied into the reaction chamber 1 was changed. The ultraviolet spectral transmittance curves of the protective films were obtained. FIG. 12 shows results of the curves. It was found from FIG. 12 that the ultraviolet cutting characteristic is improved more greatly as the monosilane content of the raw material increases. It was, however, found that a considerable amount of visible light with a short wave length is also cut to bring coloration if the molar ratio of monosilane to HMDS is larger than 5:1. Therefore, to form a protective film on the lens 10 of a car-use lamp, the molar ratio of monosilane to HMDS must be selected properly in a range of from 0:1 to 5:1 in consideration of the ultraviolet cutting characteristic, the visible light transmittance, the degree of coloration, etc.

Incidentally, to improve the ultraviolet cutting characteristic, the Si component can be increased by a method of raising the surface temperature of the plastic part. In this method, however, the ultraviolet cutting characteristic cannot be obtained sufficiently because the plastic part can withstand only to about 100° C.

As described above, in the present invention, a protective film approximately uniform in thickness and good in quality can be formed safely and easily on a surface of a plastic part having a complex three-dimensional shape, so that scratch-proofness and ultraviolet light resistance can be given to the plastic part. In this occasion, any organic solvent, or the like, is not wastefully released into the atmosphere, so that a contribution to the protection of the environment can be made. Moreover, the plastic part does not suffer from deformation and deterioration due to heat when the protective film is formed.

Also, in the present invention, HMDS is used as a raw material to thereby make it possible to form the protective film more safely and more efficiently. Moreover, the protective film obtained by this method can hold high transparency by transmitting the most part of visible light while cutting ultraviolet rays.

Further, in the present invention, hexamethyldisilane and monosilane with a large Si content are used as raw material gases for forming a protective film, so that the ultraviolet cutting characteristic is improved more greatly.

Still further, even HMDS low in vapor pressure at room temperature can be imported into the reaction chamber sufficiently as long as HMDS is mixed with a helium carrier gas. Hence, the protective film can be formed more efficiently.

A protective film of approximately uniform thickness and good quality with scratch-proofness and ultraviolet cutting characteristic is formed on a surface of a car headlamp lens. Hence, the lens has good scratch-proofness and good ultraviolet light resistance. Moreover, any organic solvent, or the like, is not wastefully released into the atmosphere when the protective film is formed. Hence, a contribution to the protection of the environment can be made. Moreover, the lens does not suffer from deformation and deterioration due to heat when the protective film is formed.

While only a certain embodiments of the invention have been specifically described herein, it will be apparent that numerous modifications may be made thereto without departing from the spirit and scope of the invention.

The present invention is based on Japanese Patent Application No. Hei. 11-162469 which is incorporated herein by reference.

What is claimed is:

1. A method of forming a protective film on a plastic car part comprising the steps of:

providing a plasma chemical vapor deposition apparatus in which a shape of at least one part of a cathode provided in a reaction chamber includes a plurality of non-planar surfaces which coincide with a shape of at least one part of the plastic car part that includes a plurality of non-planar surfaces;

attaching said plastic car part to said cathode in a condition that said plurality of nonplanar surfaces of the cathode contacts said plurality of non-planar surfaces of the plastic car part so that the parts coincident in shape contact with each other; and performing plasma chemical vapor deposition by supplying high-frequency electric power between said reaction chamber and said cathode while importing a hydrogen gas and an organic silicon gas into said reaction chamber, wherein said organic silicon gas includes hexamethyldisilane, and wherein said plastic car part is a lens for a vehicle lamp.

2. The method of forming a protective film on a plastic car part according to claim 1, wherein said organic silicon gas is hexamethyldisilane.

3. The method of forming a protective film on a plastic car part according to claim 2, wherein said hexamethyldisilane is imported together with a helium carrier gas into said reaction chamber.

4. The method of forming a protective film on a plastic car part according to claim 1, wherein said organic silicon gas includes monosilane and hexamethyldisilane in the condition that the molar ratio of monosilane to hexamethyldisilane is in a range of from 0:1 to 5:1.

5. The method of forming a protective film on a plastic car part according to claim 4, wherein said hexamethyldisilane is imported together with a helium carrier gas into said reaction chamber.

6. A plastic vehicle headlamp lens wherein a protective film is formed on a surface of said lens by a method defined in claim 1.

7. The method of forming a protecting film on a plastic car part according to claim 1, further including the step of placing said plastic car part in an ion sheath to thereby deposit ions of a uniform thickness on the surface of the plastic car part.

8. The method of forming a protective film on a plastic car part according to claim 1 wherein said cathode is formed as a complex three-dimensional shape, and further including the step of bonding pieces of polycarbonate to said cathode.

9. The method of forming a protective film on a plastic car part according to claim 1, wherein said organic silicon gas includes hexamethyldisilane and monosilane.

10. The method of forming a protective film on a plastic car part according to claim 9, wherein said monosilane is introduced to said reaction chamber through a first import pipe, and said hexamethyldisilane is introduced to said reaction chamber through a second import pipe.

11. A plasma chemical vapor disposition apparatus for forming a protective film on a plastic car part comprising:

a reactive chamber;

a cathode provided in said reactive chamber, wherein a shape of at least a part of said cathode includes a plurality of non-planar surfaces which coincides with a shape of at least a part of said plastic car part that includes a plurality of non-planar surfaces, and said cathode contacts said plastic car part such that said plurality of non-planar surfaces of said plastic car part contact with said plurality of non-planar surfaces of said cathode; and an input pipe through which an organic silicon gas is imported to said reaction chamber,
   wherein said organic silicon gas includes hexamethyldisilane, and
   wherein said plastic car part is a lens for a vehicle lamp.

12. A plasma chemical vapor disposition apparatus according to claim 11, further including an ion sheath which receives said plastic car part.

13. The plasma chemical vapor deposition apparatus according to claim 12, wherein a shape of said at least one part of the surface of the cathode is three-dimensional to match a three-dimensional shape of said at least one part of the surface of the plastic car part.

14. The method of forming a protective film on a plastic car part according to claim 1, wherein the shape of said at least one part of the surface of the cathode is three-dimensional to match a three-dimensional shape of said at least one part of the surface of the plastic car part.

* * * * *